United States Patent [19]

Hori

[11] 4,223,786
[45] Sep. 23, 1980

[54] SERIES OF ELECTRONIC COMPONENTS
[75] Inventor: Yoshio Hori, Osaka, Japan
[73] Assignee: Matsuo Electric Company, Limited, Osaka, Japan
[21] Appl. No.: 2,861
[22] Filed: Jan. 12, 1979
[30] Foreign Application Priority Data Jan. 17, 1978 [JP] Japan .................................. 53/4001

[51] Int. Cl.³ .............................................. H02B 1/04
[52] U.S. Cl. .............................. 206/330; 339/276 SF; 338/324; 361/306; 361/419; 361/425; 361/433
[58] Field of Search ............... 361/433, 306, 307, 417, 361/419, 420, 421, 425; 338/322, 324, 333, 334; 206/328, 330, 331, 343–345; 339/276 SF

[56] References Cited

U.S. PATENT DOCUMENTS 2,830,698  4/1958  Coda ..................................... 361/306
3,646,404  2/1972  Matsuo ................................ 361/433

OTHER PUBLICATIONS

Helical Storage and Transportation Process and Package, Kirschenman, Western Electric, Tech. Dig. No. 20, Oct. 1970, p. 39.

Primary Examiner—Gerald P. Tolin
Attorney, Agent, or Firm—Eugene E. Geoffrey, Jr.

[57] ABSTRACT

This invention involves forming a series of electronic components wherein each component has a pair of coplanar conductors extending therefrom which were formed from a metal strip and then severed therefrom after attachment of a component therebetween with at least one of said conductors having an enlarged portion of said strip remaining at its free end so that the pairs of component conductors when positioned between a pair of adhesive strips to hold the components in spaced relationship with at least said enlarged portion between the strips they will be securely retained thereby.

1 Claim, 5 Drawing Figures

SERIES OF ELECTRONIC COMPONENTS

This invention relates to an improved series of electronic components or so-called "taped" electronic components for automatic assemblage in a printed circuit board, and method of making same.

U.S. Pat. No. 3,646,404, granted Feb. 29, 1972 to M. Matsuo et al discloses a method of manufacturing a solid state electrolytic capacitor having lead conductors made from a web-like sheet of metal. In order to facilitate automatic assemblage of such type of capacitors in printed circuit boards, a technique so-called "taping" has been developed. According to this technique, a plurality of capacitors are held at the free ends of their lead conductors between a pair of adhesive tapes of paper or other electrically insulating material so that they are placed in order at predetermined intervals. The such "taped" capacitors are applied to an insertion machine to be assembled automatically in respective printed circuit boards. Such a technique is well known in the art, as described, for example, in the opened Japanese Pat. Nos. 51-12661 and 51-116968 and Japanese journal, "Electronic Materials," August (1977) pages 22-32.

Although this technique is effective and useful when the lead conductors are long enough to be tightly held between the tapes, it is disadvatageous when they are so short due to design problems or industrial standards, that they may fall off easily during handling.

Therefore, an object of this invention is to provide an improved structure and method of fabrication of "taped" series of electronic components such as capacitors, which overcomes the above-mentioned disadvantage.

According to a feature of this invention, each electronic component in the sequence has a pair of lead conductors projecting substantially in parallel relationship from the component and in the same direction. The free ends of the lead conductors are secured between a pair of web-like materials so that the components are placed in order at predetermined intervals. One of the lead conductors of each component has a flat portion at its free end and this portion is substantially widened as compared with the lead conductor and is formed integrally with the lead conductor.

Other objects and features of this invention will be described hereinunder in more detail with reference to the accompanying drawings.

IN THE DRAWINGS

Figure 1:
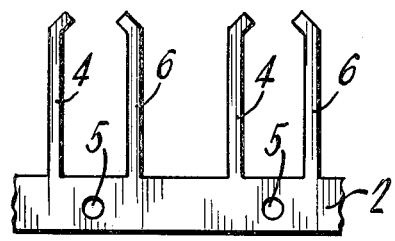
FIG. 1 is a plan view representing a step in the preparation of lead conductors for the series of electronic components.
Figure 2:
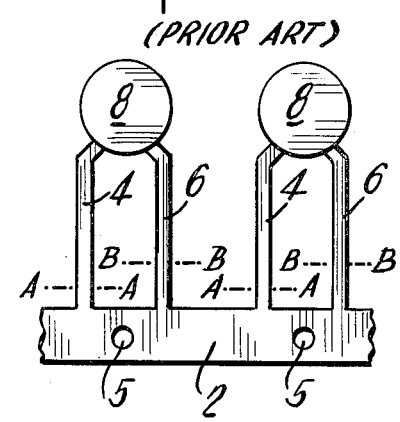
FIGS. 2 and 3 are plan views representing steps of fabricating a series of "taped" electronic components according to the prior art.

In case of making electronic components, such as capacitors, of this kind, a web-like metal sheet of copper or the like is punched or etched into a pattern, as shown in FIG. 1, in which pairs of lead conductors 4 and 6 project in a comb-like shape from a support web 2 having pilot holes 5 at constant intervals. Then, an electronic element 8 such as capacitor element is bonded between each pair of conductors 4 and 6, as shown in FIG. 2, by means of welding, soldering or other similar known technique.

According to a prior art method, the lead conductors 4 and 6 are then cut along lines A—A and B—B, respectively, to separate each electronic component from the support web 2. While, in the drawing, the lines A—A and B—B are made different in order to indicate the polarity of component with the length of lead conductor, they may be same when the component has no polarity.

Figure 3:
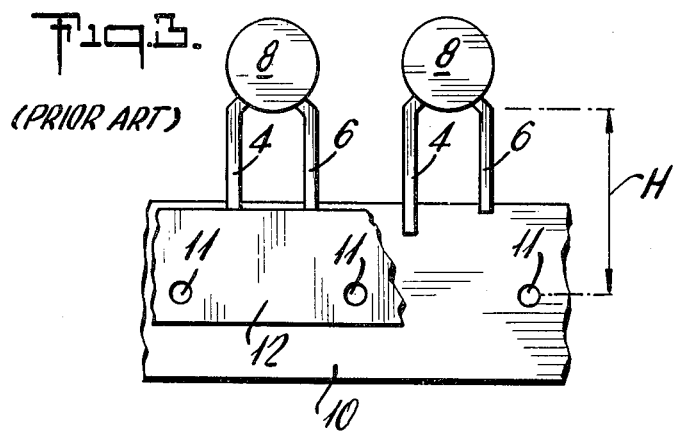

In the next step, as shown in FIG. 3, the free ends of lead conductors 4 and 6 of each component are placed and secured between two adhesive paper tapes 10 and 12 so that the components are placed in order at predetermined intervals, and pilot holes 11 are formed in the tapes 10 and 12 at these intervals for indexing the "taped" components on an insertion machine.

It should be clear from FIG. 3 that the component falls off easily from the tapes 10 and 12 when only a small part of the lead conductors is put between the tapes. Although this problem can be avoided by making the conductors long enough or reducing the height H of the conductor shoulder from the pilot hole 11, the former increases the loss of sheet metal material for the conductors and the latter is often limited by industrial standards.

Figure 4:
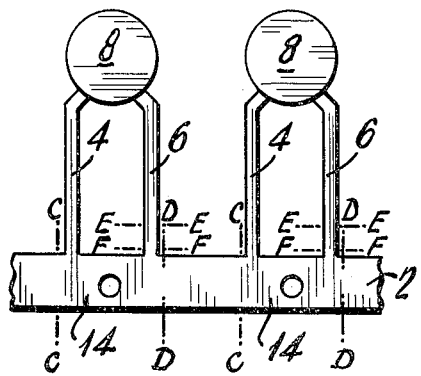
FIGS. 4 and 5 are plan views representing steps of fabricating a series of "taped" electronic components according to this invention.

According to the method of this invention, as shown in FIG. 4, the electronic components are separated by cutting the support web 2 along lines C—C and D—D and the lead conductor 6 along lines E—E and F—F, thereby leaving a portion 14 of the support web 2 integral with the lead conductor 4.

Figure 5:
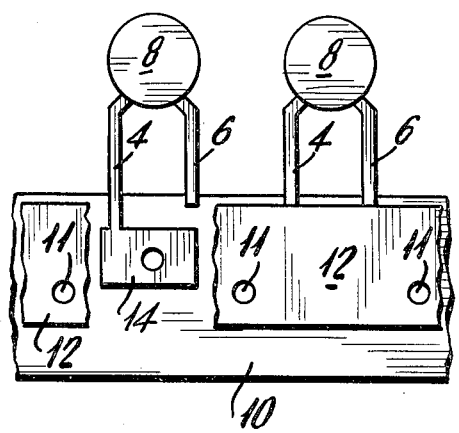

Then, as shown in FIG. 5, the components are "taped" in a manner similar to FIG. 3 except that the widened portion 14 is put fully between the tapes 10 and 12. It should be understood easily from the drawing that the electronic components can be held much more strongly by the tapes than in the case of FIG. 3 of the prior art. The widened portion 14 may also serve as a polarity mark.

This invention is applicable to various electronic components such as resistors, diodes and the like, in addition to capacitors, since they involve similar problems. The tape material and details of "taping" process are well known in the art and are not the factors concerning this invention.

What is claimed is:

1. A strip of electronic components comprising a plurality of components each having a pair of lead conductors projecting substantially in parallel relationship to each other from said component and in the same direction, the free ends of said lead conductors being positioned and secured between a pair of web-like strips of material and spaced successively at predetermined intervals, and at least one of said lead conductors of each component having an integral flat portion at the free end, said flat portion having a greater width as compared with the rest of said lead conductor and formed integrally with said lead conductor whereby said strips will securely retain said components in said predetermined spaced positions and orientation relative to said strips.

* * * * *